(12) United States Patent
Soh

(10) Patent No.: US 7,528,670 B2
(45) Date of Patent: May 5, 2009

(54) SINE WAVE OSCILLATOR HAVING A SELF-STARTUP CIRCUIT

(75) Inventor: Myung Jin Soh, Gyeonggi-do (KR)

(73) Assignee: Luxen Technologies, Inc., Seoul (KR)

( * ) Notice: Subject to any disclaimer, the term of this patent is extended or adjusted under 35 U.S.C. 154(b) by 0 days.

(21) Appl. No.: 12/098,654

(22) Filed: Apr. 7, 2008

(65) Prior Publication Data

US 2008/0252389 A1 Oct. 16, 2008

(30) Foreign Application Priority Data

Apr. 9, 2007 (KR) .................. 10-2007-0034731

(51) Int. Cl.
*H03B 5/26* (2006.01)
(52) U.S. Cl. .................. 331/141; 331/138; 331/175
(58) Field of Classification Search ............. 331/138, 331/140, 141, 142, 111, 143, 153, 108 R, 331/175

See application file for complete search history.

(56) References Cited

U.S. PATENT DOCUMENTS

| 6,300,844 | B1 * | 10/2001 | Sanner | 331/141 |
| 6,472,945 | B1 * | 10/2002 | Gumm | 331/138 |
| 2004/0041599 | A1 * | 3/2004 | Murphy | 327/129 |

FOREIGN PATENT DOCUMENTS

DE 2945999 A * 6/1980

* cited by examiner

*Primary Examiner*—Benny Lee
*Assistant Examiner*—Ryan J. Johnson
(74) *Attorney, Agent, or Firm*—Steptoe & Johnson LLP

(57) ABSTRACT

Disclosed herein is a sine wave oscillator having a self-startup circuit. The sine wave oscillator can start up and output sine waves having a constant frequency without receiving any signals other than supply voltage. The sine wave oscillator includes an operational amplification unit, a first resistor, a first capacitor, a second capacitor, a second resistor, a third resistor, a fourth resistor, and a startup circuit.

7 Claims, 8 Drawing Sheets

[Fig. 1]
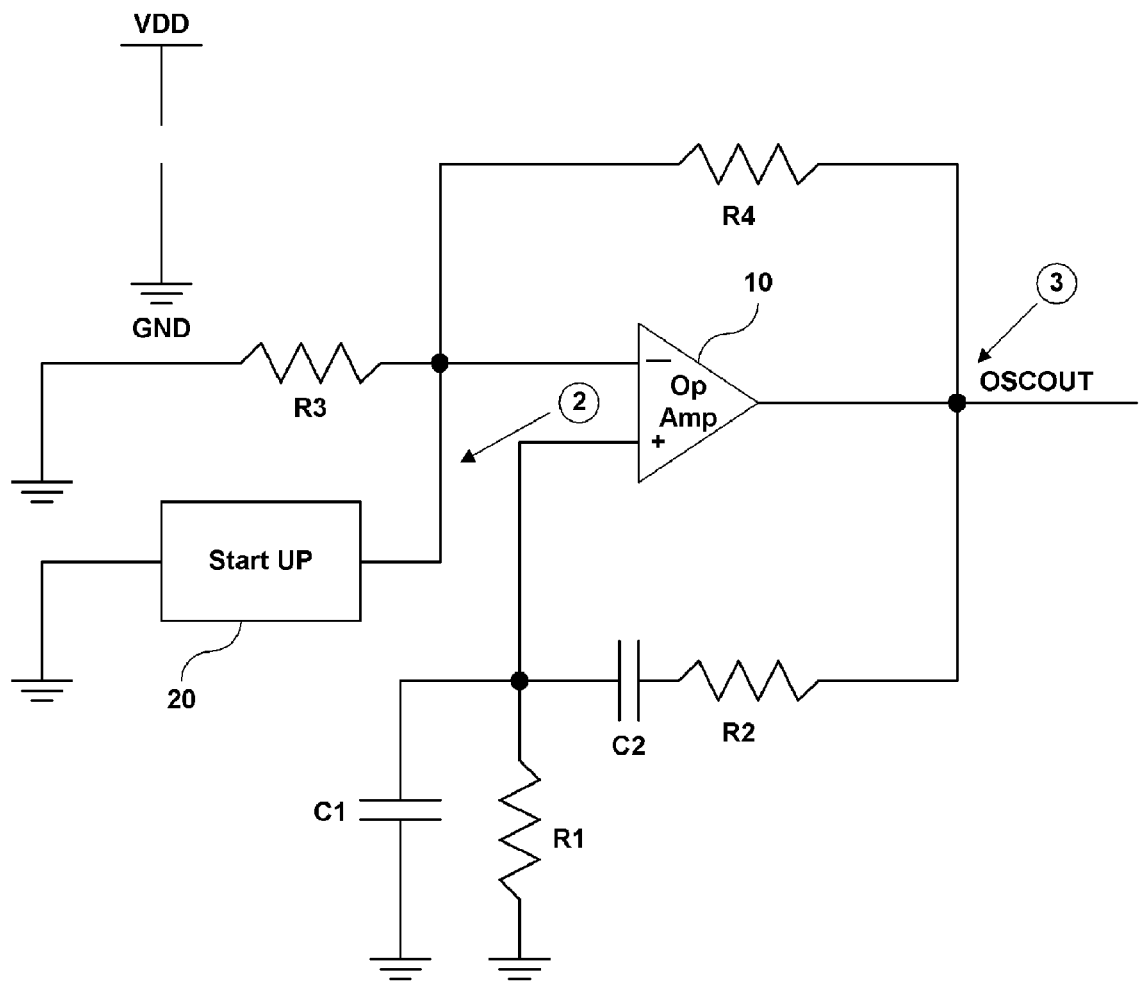

[Fig. 2]
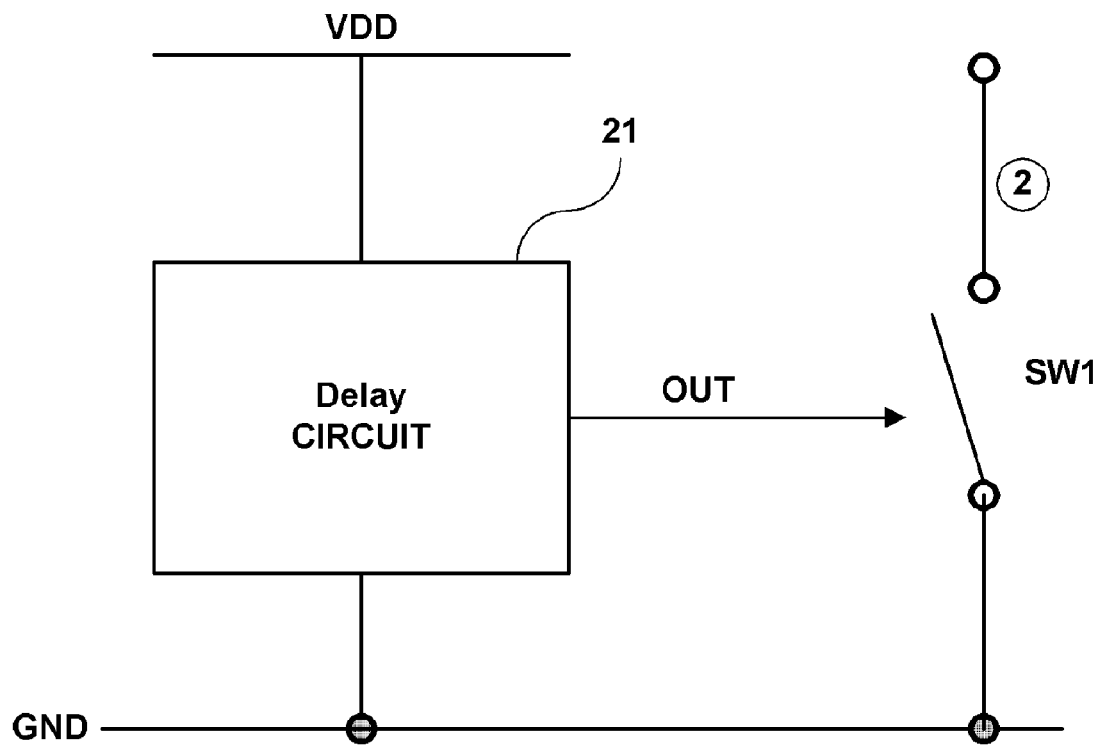

[Fig. 3]
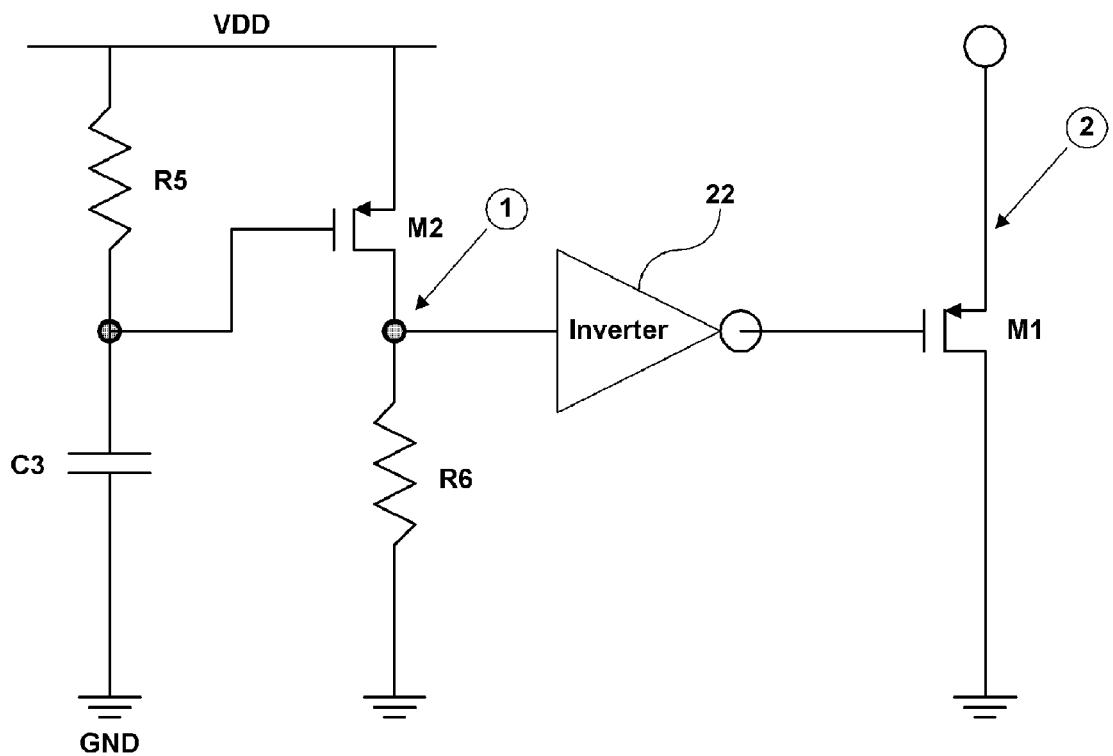

[Fig. 4]
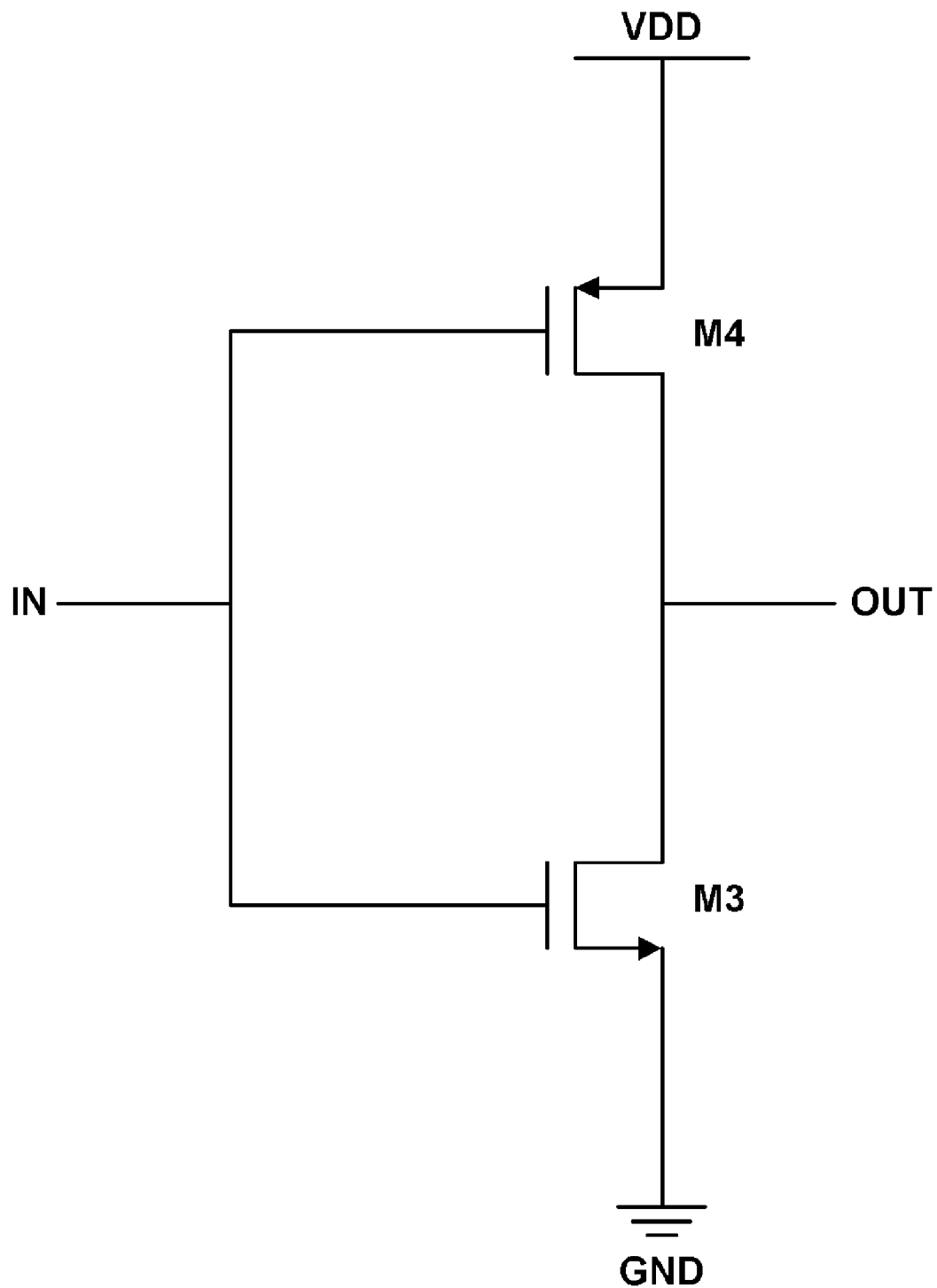

[Fig. 5A]
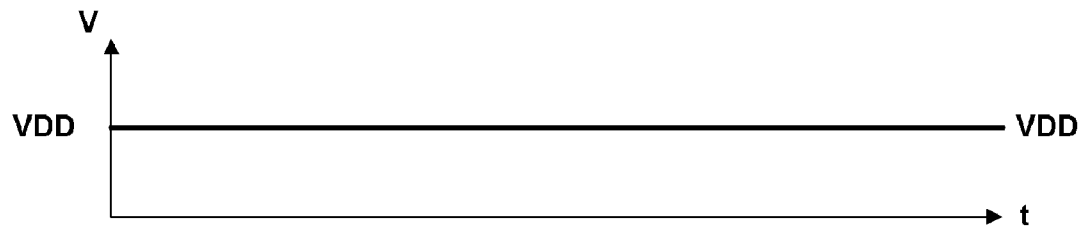
[Fig. 5B]
[Fig. 5C]
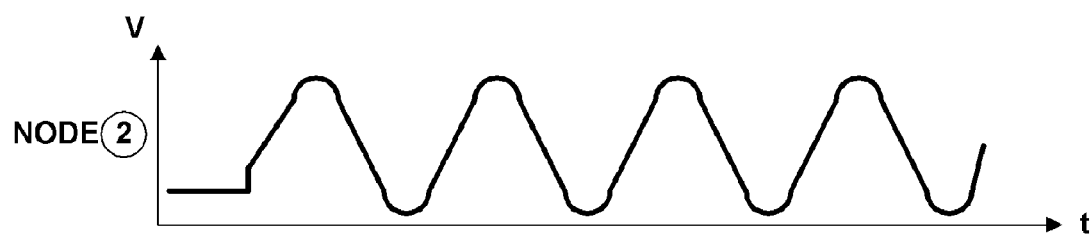
[Fig. 5D]
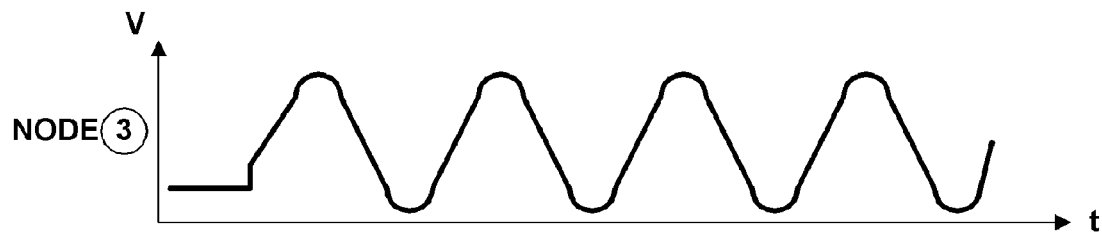

[Fig. 6]
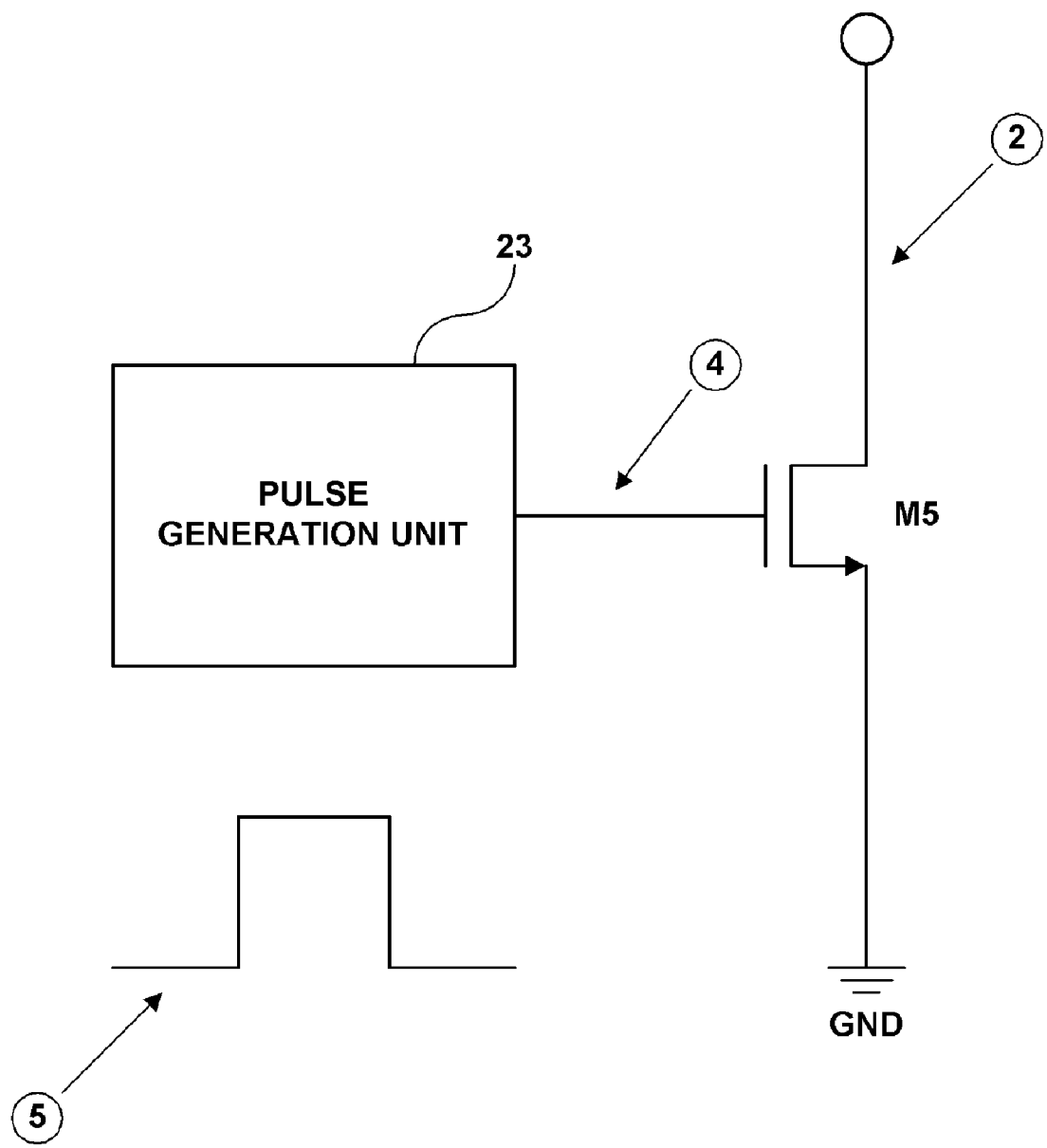

[Fig. 7]
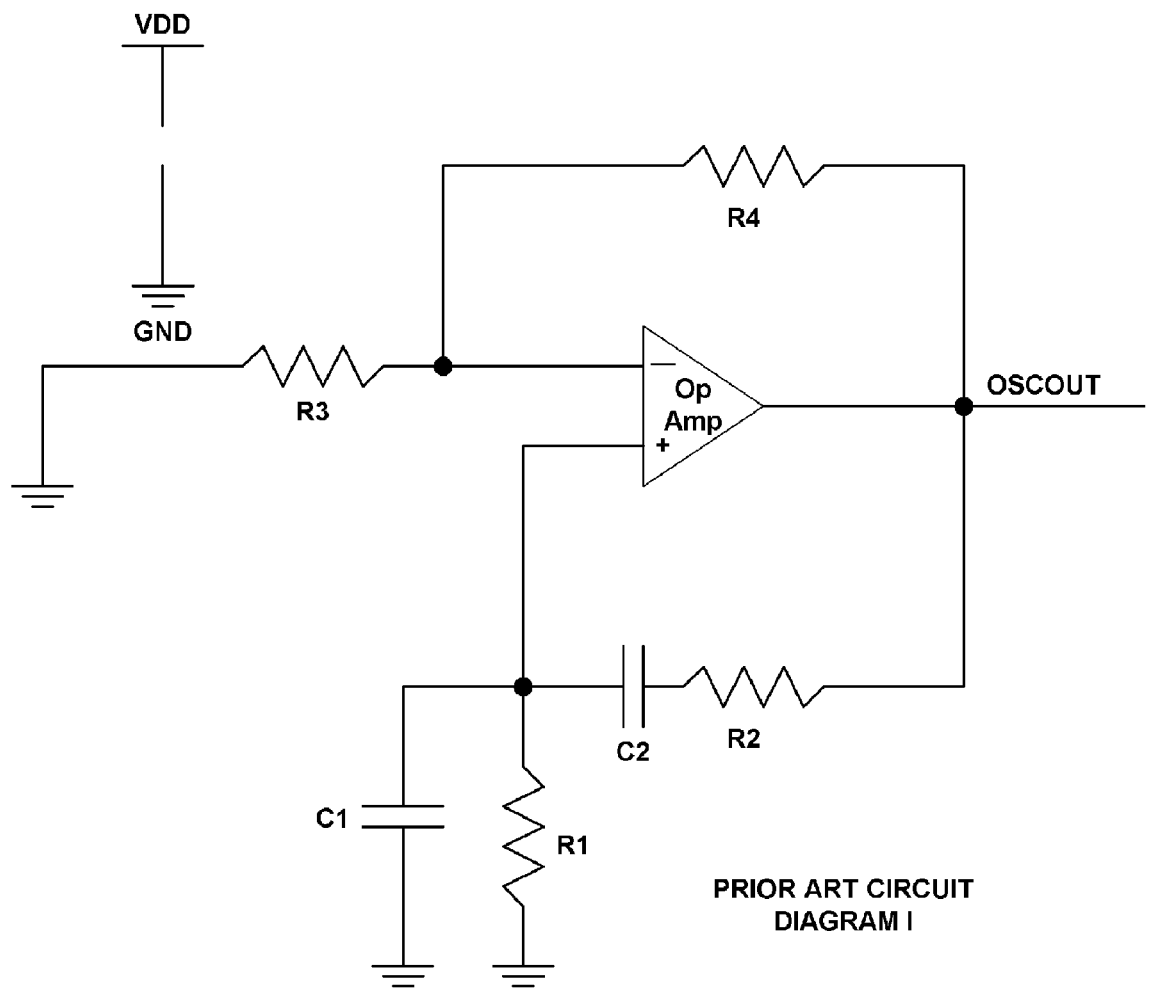
PRIOR ART CIRCUIT
DIAGRAM I

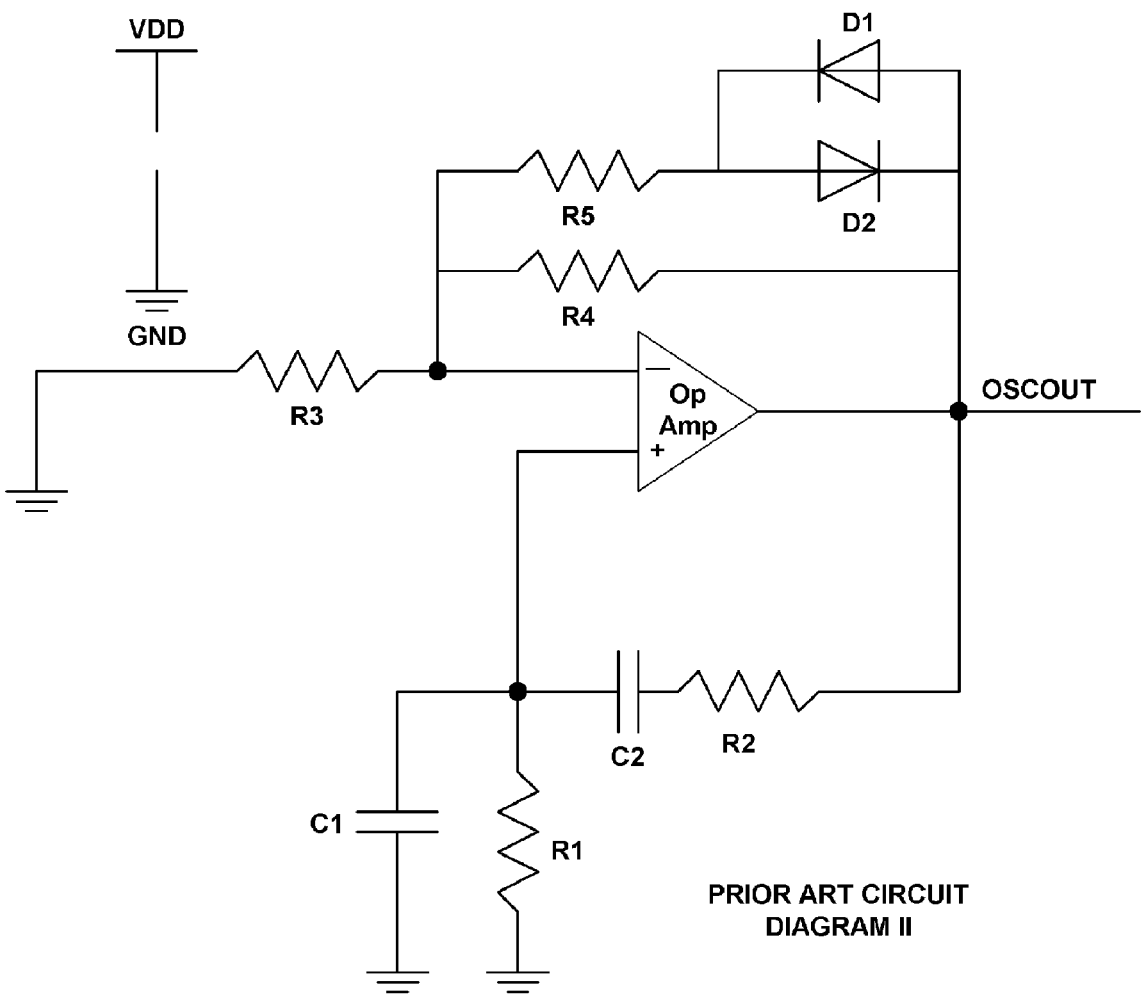
[Fig. 8]
PRIOR ART CIRCUIT
DIAGRAM II

SINE WAVE OSCILLATOR HAVING A SELF-STARTUP CIRCUIT

CLAIM OF PRIORITY

This application claims priority under 35 USC 119 to to Korean Patent Application No. 10-2007-0034731, filed on Apr. 9, 2007, which is incorporated by reference in its entirety.

BACKGROUND OF THE INVENTION

1. Field of the Invention

The present invention relates generally to a sine wave oscillator and, more particularly, to a sine wave oscillator having a self-startup circuit that is adapted to self-oscillate without requiring any input signals other than a supply voltage, and to output sine waves having a constant frequency.

2. Description of the Related Art

A typical oscillator is an oscillator for generating pulses, converting the waveforms of the generated pulses, and outputting sine waves. Such an oscillator is widely used because it is easy to implement the oscillator from the point of view of circuit construction and it is also easy to perform frequency control. However, this oscillator has shortcomings: the construction of circuits is complicated because a waveform converter for outputting sine waves requires a separate resistor, capacitor and amplifier, and in that the extent of distortion of sine waves is relatively high because square waves are converted into sine waves.

As a result, an oscillator, including an operational amplifier, resistor and capacitor, capable of generating sine waves having low waveform distortion is widely used as a sine wave oscillator (see the conventional circuit diagram of FIG. 7).

However, such an R-C oscillator is not able to be oscillated initially merely by the application of supply voltage.

Hence there are many methods for initializing oscillators. One widely used method is the technology of connecting a feedback resistor R4, a parallel resistor R5, and diodes D1 and D2, between the output and negative input terminal of an amplifier, as shown in FIG. 8, thereby facilitating startup.

Referring to the construction and operation of the conventional circuit of FIG. 7, resistors R3 and R4, connected in series to each other, are connected to a negative feedback circuit. Negative feedback gain $\beta$ is $(1+R4/R3)$, and positive feedback gain K is $jw(C1R2/[(1-w^2C1C2R1R2)+jw(C1R1+C2R2+C1R2)]$. The condition for maintaining oscillation is that a value, obtained by multiplying the positive and negative feedback gains by each other, must be 1, which is expressed by the equation $K\beta=1$. It can be seen that the equality $(1+R4/R3)=(1+C2/C1+R1/R2)$ must be satisfied.

However, since oscillation can be generated in its early stage only when there is sufficient negative feedback gain, the inequality $(1+R4/R3)>>(1+C2/C1+R1/R2)$ must be satisfied. The conventional circuit of FIG. 7 has no circuit for implementing this, thus initial startup oscillation is difficult to occur.

In FIG. 8, the resistor R5 and the diodes D1 and D2 are added as a circuit construction for facilitating the startup of oscillation in FIG. 7. In this circuit, the forward resistances of the diodes are very low and the diodes D1 and D2 have high resistances because the diodes D1 and D2 are all "OFF" before the start of oscillation, resulting in a large negative feedback gain, which meets the initial startup condition, can be obtained if the values of the resistors R4 and R5 are appropriately selected. Accordingly, using the additional circuits, the startup of oscillation can be easily achieved, and oscillation can be maintained.

However, the conventional circuit has a problem in that the generated frequency value varies after initial oscillation because the forward resistance value of the diode varies with the magnitude of voltage across both ends of the diode. Accordingly, the conventional circuit is not appropriate for an accurate frequency oscillator.

Although further methods and circuits for generating and outputting sine waves having desired frequencies using various technologies have been developed and used, the demand for a circuit for performing easier and more stable startup and maintaining generated frequencies is rising.

SUMMARY OF THE INVENTION

The present invention has been made keeping in mind the above problems occurring in the prior art, and the object of the present invention is to provide a sine wave oscillator having a self-startup circuit that is capable of self-oscillating without requiring any input signals other than a supply voltage and outputting sine waves having a constant frequency.

In order to accomplish the above object, the present invention, in FIG. 1, provides a sine wave oscillator having a self-startup circuit, including an operational amplification unit which operationally amplifies the input signals and then outputs; the first resistor and the first capacitor, the first ends of which are connected in parallel to the plus input terminal of the operational amplification unit and the second ends of which are connected to a minus power terminal; the second capacitor, the first end of which is connected to the plus input terminal of the operational amplification unit; the second resistor, the first end of which is connected in series to the second end of the second capacitor and the second end of which is connected to the output terminal of the operational amplification unit; the third resistor, the first end of which is connected to the minus input terminal of the operational amplification unit and the second end of which is connected to the minus power terminal; the fourth resistor, which is connected between the minus input terminal of the operational amplification unit and the output terminal of the operational amplification unit; and the startup circuit, the first end of which is connected to the minus input terminal of the operational amplification unit and the second end of which is connected to the minus power terminal.

BRIEF DESCRIPTION OF THE DRAWINGS

The above and other objects, features and other advantages of the present invention will be more clearly understood from the following detailed description taken in conjunction with the accompanying drawings:

FIG. 1 is a circuit diagram of a sine wave oscillator having a self-startup circuit according to an embodiment of the present invention;

FIG. 2 is a detailed circuit diagram of the startup circuit of FIG. 1;

FIG. 3 is a detailed circuit diagram of the delay circuit of FIG. 2;

FIG. 4 is a detailed circuit diagram of the inverter of FIG. 3;

FIGS. 5A to 5D are operational waveform diagrams for FIGS. 1 to 3;

FIG. 6 is a detailed circuit diagram showing another embodiment of the startup circuit of FIG. 1, which employs a pulse generation unit and an NMOS;

FIG. 7 is a circuit diagram of a conventional sine wave oscillator; and

FIG. 8 is a circuit diagram showing an example in which the conventional sine wave oscillator of FIG. 7 is provided with an auxiliary startup circuit.

DESCRIPTION OF THE PREFERRED EMBODIMENTS

Reference now should be made to the drawings. Same reference numerals are used throughout the different drawings to designate the same or similar components.

An embodiment of a sine wave oscillator having a self-startup circuit according to the technical spirit of the present invention will be described with reference to the accompanying drawings.

FIG. 1 is a circuit diagram of a sine wave oscillator having a self-startup circuit according to an embodiment of the present invention.

As shown in FIG. 1, the sine wave oscillator having a self-startup circuit includes an operational amplification unit 10, Op Amp, which operationally amplifies and outputs input signals; the first resistor R1 and the first capacitor C1, the first ends of which are connected in parallel to the plus (+) input terminal of the operational amplification unit 10 and the second ends of which are connected to a minus (−) power terminal GND; the second capacitor C2, the first end of which is connected to the plus (+) input terminal of the operational amplification unit 10; the second resistor R2, the first end of which is connected in series to the second end of the second capacitor C2 and the second end of which is connected to the output terminal OSC Out of the operational amplification unit 10; the third resistor R3, the first end of which is connected to the minus (−) input terminal of the operational amplification unit 10 and the second end of which is connected to the minus (−) power terminal GND; the fourth resistor R4, which is connected between the minus (−) input terminal of the operational amplification unit 10 and the output terminal OSC Out of the operational amplification unit 10; the startup circuit 20, the first end of which is connected to the minus (−) input terminal of the operational amplification unit 10 and the second end of which is connected to the minus (−) power terminal GND.

FIG. 2 is a detailed circuit diagram of the startup circuit 20 of FIG. 1.

As shown in FIG. 2, the startup circuit 20 includes a delay circuit 21 which is connected between the supply voltage plus terminal VDD and the minus (−) power terminal GND, the output of which is connected to a switch SW1; the switch SW1, which receives the output of the delay circuit 21 and performs switching on the output of the delay circuit 21.

With regard to the switch SW1, when supply voltage is applied to the delay circuit 21 and the delay circuit 21 delays the supply voltage and applies the delayed supply voltage to the switch SW1, the switch SW1 is turned "OFF" after a predetermined delay time has passed in an "ON" state.

FIG. 3 is a detailed circuit diagram of the delay circuit 21 of FIG. 2.

As shown in FIG. 3, the delay circuit 21 includes a fifth resistor R5, the first end of which is connected to the supply voltage plus (+) terminal VDD; the third capacitor C3, the first end of which is connected to the fifth resistor R5 and the second end of which is connected to the minus (−) power terminal GND; the second P-channel Metal-Oxide Semiconductor (PMOS) transistor M2, the gate of which is connected between the fifth resistor R5 and the third capacitor C3, the source of which is connected to the supply voltage plus (+) terminal VDD, and the drain of which is connected to a sixth resistor R6; the sixth resistor R6, the first end of which is connected to the second PMOS transistor M2 and the second end of which is connected to the minus (−) power terminal GND; an inverter 22, the input terminal of which is connected to the drain of the second PMOS transistor M2 and the output terminal of which is connected to a first PMOS transistor M1; the first PMOS transistor M1, the gate of which is connected to the output terminal of the inverter 22, the source of which is connected to the minus (−) input terminal of the operational amplification unit 10, and the drain of which is connected to the minus (−) power terminal GND.

FIG. 4 is a detailed circuit diagram of the inverter 22 of FIG. 3.

As shown in FIG. 4, the inverter 22 includes a third N-channel Metal-Oxide Semiconductor (NMOS) transistor M3, the gate of which is connected to the drain of the second PMOS transistor M2, the source of which is connected to the minus (−) power terminal GND, and the drain of which is connected to the switch SW1; the fourth PMOS transistor M4, the gate of which is connected to the drain of the second PMOS transistor M2, the source of which is connected to the supply voltage plus (+) terminal VDD, and the drain of which is connected to the switch SW1.

FIG. 6 is a detailed circuit diagram showing another embodiment of the startup circuit of FIG. 1, which employs a pulse generation unit and an NMOS.

As shown in FIG. 6, the startup circuit 20 includes a pulse generation unit 23 which generates a pulse; the fifth NMOS transistor M5, the gate of which is connected to the pulse generation unit 23, the drain of which is connected to the minus (−) input terminal of the operational amplification unit 10, and the source of which is connected to the minus (−) power terminal GND.

A sine wave oscillator having a self-startup circuit according to the preferred embodiment of the present invention will be described in detail below. If, in the following description of the present invention, it is determined that detailed descriptions of related well-known functions or constructions may make the gist of the present invention obscure, the descriptions will be omitted. The following terms are terms that are defined in consideration of functions in the present invention. The meanings of the terms may vary according to a user's or an operator's intention or judicial cases, thus the meanings of the terms must be interpreted based on the overall context of the present specification.

First, the present invention is intended to self-oscillate without requiring input signals other than a supply voltage and to output sine waves having a constant frequency.

As described in the sections "Field of the Invention" and "Description of the Related Art," a sine wave oscillator must maintain initial oscillation and a generated frequency on a uniform basis. The object of the present invention is to provide a circuit that has a considerably large negative feedback gain (1+R4/R3) at the time of initial oscillation, compared to that of the conventional circuit diagram (FIG. 7), and that can maintain a generated frequency at a uniform magnitude after the initial oscillation. Accordingly, the present invention provides a stable sine wave oscillator that can overcome the startup problem with the conventional oscillators, occurring because a loop gain (a product of positive and negative feedback gains) is uniform both at the time of initial oscillation and after initial oscillation, as shown in FIG. 7, and that can eliminate a frequency instability factor, occurring because the resistance value varies after initial oscillation, as shown in FIG. 8.

The sine wave oscillator of the present invention is configured to include an operational amplification unit 10, Op Amp, four resistors, and two capacitors, as shown in FIG. 1. As shown in FIG. 1, the third resistor R3 is connected between the minus (−) input terminal of the operational amplification unit 10, Op Amp, and the minus (−) power terminal GND, and the fourth resistor R4 is connected between the minus (−) input terminal of the operational amplification unit 10 and the output terminal OSC Out of the operational amplification unit 10. Furthermore, the second resistor R2 and the second capacitor C2 are connected in series to each other between the output terminal of the operational amplification unit 10 and the plus (+) input terminal of the operational amplification unit 10, and the first resistor R1 and the first capacitor C1 are connected in parallel to each other between the plus (+) input terminal of the operational amplification unit 10 and the minus (−) power terminal GND. Furthermore, the startup circuit 20 is connected between the minus (−) input terminal of the operational amplification unit 10 and the minus (−) power terminal GND.

FIG. 2 is a detailed circuit block diagram of the startup circuit of FIG. 1. In this diagram, the delay circuit 21 is connected between the supply voltage plus terminal VDD and the minus (−) power terminal, and the output "OUT" of the delay circuit 21 is applied to the switch SW1. When supply voltage is applied to the delay circuit 21 and the delay circuit 21 delays the supply voltage and applies the delayed supply voltage to the switch SW1, the switch SW1 is turned "OFF" after a predetermined delay time has passed in an "ON" state.

FIG. 3 shows an embodiment of the startup circuit 20. In this circuit, the fifth resistor R5 and the third capacitor C3 are connected in series to each other between the supply voltage plus (+) terminal VDD and the minus (−) power terminal GND. Furthermore, the source of the PMOS M2 is connected to the supply voltage plus (+) terminal, the gate thereof is connected between the fifth resistor R5 and the third capacitor C3, and the drain thereof is connected in series to the sixth resistor R6 and, in turn, is connected to the supply voltage minus (−) terminal GND. Furthermore, the input terminal (node ①) of the inverter 22 is connected to the drain of the PMOS M2, the output terminal of the inverter 22 is connected to the gate of the PMOS M1, and the drain of the PMOS M1 is connected to the minus (−) power terminal GND. The source (node ②) of the PMOS M1 is connected to the minus (−) input terminal of the operational amplification unit 10 of FIG. 1.

Referring to the operations of FIGS. 2 and 3, although supply voltage is applied across the plus power terminal VDD and minus power terminal GND of FIG. 3, the gate of the PMOS M2 of FIG. 3 is grounded, and thus the PMOS M2 is in "ON" state because there is no charge in the third capacitor C3 in its early stage. When, over time, the third capacitor C3 is charged with electric charges through the fifth resistor R5 and the gate voltage of the PMOS M2 becomes higher than "VDD—the threshold voltage Vth of M2," the PMOS M2 is switched from the "ON" state to "OFF." In this case, the input voltage (Node ①) of the inverter 22, connected to the drain of the MPMOS M2, is switched from an initial high state to a low state, and the output voltage of the inverter 22 is switched from low (power minus voltage) to high (supply plus voltage), and thus the PMOS M1 is switched from an "ON" state to an "OFF" state. When the PMOS M1 is turned "OFF," the startup circuit 20 is completely separated from the oscillator of FIG. 1.

The startup operation of the above-described sine wave oscillator having a startup circuit, shown in FIG. 1, is described. That is, when the PMOS M1 is in an "ON" state, the negative feedback gain, generated by the "ON" resistance ($r_{ds}$_pmos) of the PMOS M1 transistor and the resistor R4, is "1+R4/$r_{ds}$_pmos" and $r_{ds}$_pmos is very low in the "ON" state, so that the negative feedback gain is very high, with the result that oscillation can be easily generated. Meanwhile, when the PMOS M1 is turned "OFF," the negative feedback gain of the sine wave oscillator of FIG. 1 is "1+R4/R3," so that the condition for maintaining oscillation is met, with the result that the oscillation can be maintained at a uniform oscillation frequency.

FIG. 4 shows the inverter circuit. The NMOS M3 and the PMOS M4 are connected in series to each other between the supply voltage plus (+) terminal and the minus (−) terminal.

Meanwhile, FIGS. 5A to 5D show examples of waveforms at respective points ①, ② and ③ of FIGS. 1 to 3. FIG. 5A shows supply voltage VDD, FIG. 5B shows a change in voltage input to the inverter at the node ① of FIG. 3, FIG. 5C shows a change in waveform at the node ② of FIGS. 1, 2 and 3, and FIG. 5D shows a waveform at the point of the output OSC Out of the oscillator, which is the node ③.

Meanwhile, as shown in FIG. 6, the oscillator can be started up by employing an NMOS M1 as the switch SW1 of FIG. 2 and applying a pulse to the gate of the NMOS. When the pulse generation unit 23 generates a pulse, illustrated by the indication ⑤ of FIG. 6 at node ④, the gain of a negative feedback circuit is high due to a feedback circuit, formed of the "ON" resistor $r_{ds}$_nmos of the NMOS and the resistors R3 and R4 of FIG. 1, during the high phase of the pulse, and thus oscillation can be easily generated during this phase. In contrast, the NMOS M5 is turned "OFF" during the low phase of the pulse, so that the startup circuit 20 is separated from the oscillator of FIG. 1, and thus oscillation is maintained by the negative feedback gain generated by the resistors R3 and R4.

As described above, the oscillator of the present invention self-oscillates without requiring any input signals other than a supply voltage, and outputs sine waves having a constant frequency.

As described above, the sine wave oscillator having a self-startup circuit according to the present invention is a circuit that is capable of facilitating the occurrence of oscillation and maintaining the generated sine wave. The present invention has an advantage in that the signal wave oscillator having functions that cannot be realized by the conventional oscillators can be implemented.

Although the preferred embodiments of the present invention have been disclosed for illustrative purposes, those skilled in the art will appreciate that various modifications. Additions and substitutions are possible, without departing from the scope and spirit of the invention as disclosed in the accompanying claims.

What this patent claims is:

1. A sine wave oscillator having a self-startup circuit, comprising:
   an operational amplification unit which operationally amplifies and outputs input signals;
   a first resistor and a first capacitor each having first ends connected in parallel to a plus input terminal of the operational amplification unit and second ends connected to a minus power terminal;
   a second capacitor having a first end connected to the plus input terminal of the operational amplification unit;
   a second resistor having a first end connected in series to a second end of the second capacitor and a second end connected to an output terminal of the operational amplification unit;

a third resistor having a first end connected to the minus input terminal of the operational amplification unit and a second end connected to the minus power terminal;

a fourth resistor connected between the minus input terminal of the operational amplification unit and the output terminal of the operational amplification unit; and a startup circuit having a first end connected to the minus input terminal of the operational amplification unit and a second end connected to the minus power terminal, the startup circuit comprising:
  a switch, and
  a delay circuit connected between a supply voltage plus terminal and a minus power terminal and having an output connected to the switch;
  wherein the switch receives the output of the delay circuit and performs switching on the output of the delay circuit.

2. The sine wave oscillator as set forth in claim 1, wherein the switch, when supply voltage is applied to the delay circuit and the delay circuit delays the supply voltage and applies the delayed supply voltage to the switch, is turned "OFF" after a predetermined delay time has passed in an "ON" state.

3. The sine wave oscillator as set forth in claim 1, wherein the delay circuit comprises:
  a fifth resistor having a first end connected to the supply voltage plus terminal;
  a third capacitor having a first end connected to the fifth resistor and a second end connected to the minus power terminal;
  a sixth resistor;
  a second P-channel Metal-Oxide Semiconductor (PMOS) transistor, having a gate connected between the fifth resistor and the third capacitor, a source connected to the supply voltage plus terminal, and a drain connected to the sixth resistor, the sixth resistor, having a first end connected to the second PMOS transistor and a second end connected to the minus power terminal;
  a first PMOS transistor; and
  an inverter having an input terminal connected to the drain of the second PMOS transistor and an output terminal connected to the first PMOS transistor, first PMOS transistor having a gate connected to the output terminal of the inverter, a source connected to the minus input terminal of the operational amplification unit, and a drain connected to the minus power terminal.

4. The sine wave oscillator as set forth in claim 3, wherein the inverter comprises:
  a third N-channel Metal-Oxide Semiconductor (NMOS) transistor having a gate connected to the drain of the second PMOS transistor, a source connected to the minus power terminal, and a drain connected to the switch; and
  a fourth PMOS transistor having a gate connected to the drain of the second PMOS transistor, a source connected to the supply voltage plus terminal, and a drain connected to the switch.

5. The sine wave oscillator as set forth in claim 2, wherein the delay circuit comprises:
  a fifth resistor having a first end connected to the supply voltage plus terminal;
  a third capacitor having a first end connected to the fifth resistor and a second end connected to the minus power terminal;
  a sixth resistor;
  a second PMOS transistor having a gate connected between the fifth resistor and the third capacitor, a source connected to the supply voltage plus terminal, and a drain connected to the sixth resistor, sixth resistor having a first end connected to the second PMOS transistor and a second end connected to the minus power terminal;
  a first PMOS transistor; and
  an inverter having an input terminal connected to the drain of the second PMOS transistor and an output terminal connected to the first PMOS transistor, the first PMOS transistor having a gate connected to the output terminal of the inverter, a source connected to the minus input terminal of the operational amplification unit, and a drain connected to the minus power terminal.

6. The sine wave oscillator as set forth in claim 5, wherein the inverter comprises:
  a third NMOS transistor having a gate connected to the drain of the second PMOS transistor, a source connected to the minus power terminal, and a drain connected to the switch; and
  a fourth PMOS transistor having a gate connected to the drain of the second PMOS transistor, a source connected to the supply voltage plus terminal, and a drain connected to the switch.

7. The sine wave oscillator as set forth in claim 1, wherein the startup circuit comprises:
  a pulse generation unit which generates a pulse; and
  a NMOS transistor having a gate connected to the pulse generation unit, a drain connected to the minus input terminal of the operational amplification unit, and a source connected to the minus power terminal.

* * * * *